(12) United States Patent
Hamilton et al.

(10) Patent No.: US 10,153,268 B2
(45) Date of Patent: Dec. 11, 2018

(54) ORGANIC SURFACE TREATMENTS FOR DISPLAY GLASSES TO REDUCE ESD

(71) Applicant: Corning Incorporated, Corning, NY (US)

(72) Inventors: James Patrick Hamilton, Horseheads, NY (US); Robert George Manley, Vestal, NY (US); Jonathan Michael Mis, Horseheads, NY (US); Wanda Janina Walczak, Big Flats, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/502,535

(22) PCT Filed: Aug. 7, 2015

(86) PCT No.: PCT/US2015/044226
§ 371 (c)(1),
(2) Date: Feb. 8, 2017

(87) PCT Pub. No.: WO2016/025320
PCT Pub. Date: Feb. 18, 2016

(65) Prior Publication Data
US 2017/0222025 A1    Aug. 3, 2017

Related U.S. Application Data

(60) Provisional application No. 62/036,166, filed on Aug. 12, 2014.

(51) Int. Cl.
*H01L 27/02* (2006.01)
*H01L 23/60* (2006.01)
(Continued)

(52) U.S. Cl.
CPC .......... *H01L 27/0251* (2013.01); *C03C 17/28* (2013.01); *C03C 17/30* (2013.01);
(Continued)

(58) Field of Classification Search
CPC .... H01L 23/60–23/62; H01L 29/78666; H01L 29/78675; H01L 29/66757; H01L 27/0251; H01L 27/0248; C03C 17/28
See application file for complete search history.

(56) References Cited

U.S. PATENT DOCUMENTS 3,338,696 A    8/1967    Dockerty
3,682,609 A    8/1972    Dockerty
(Continued)

FOREIGN PATENT DOCUMENTS

WO    2014179153 A1    11/2014

OTHER PUBLICATIONS

International Search Report and Written Opinion of the International Searching Authority; PCT/US2015/044226; dated Oct. 29, 2015; 13 Pages; Korean Intellectual Property Office.
(Continued)

*Primary Examiner* — Selim Ahmed
*Assistant Examiner* — Evan Clinton
(74) *Attorney, Agent, or Firm* — Kevin M. Able

(57) ABSTRACT

Glass substrates comprising an A-side upon which silicon thin film transistor devices can be fabricated and a B-side having a substantially homogeneous organic film thereon are described. The organic film includes a moiety that reduces voltage generation by contact electrification or triboelectrification. Methods of manufacturing the glass substrates and example devices incorporating the glass substrates are also described.

17 Claims, 3 Drawing Sheets

(51) Int. Cl.
*C03C 17/28* (2006.01)
*C03C 17/30* (2006.01)
*H01L 21/02* (2006.01)
*H01L 27/12* (2006.01)

(52) U.S. Cl.
CPC ........ *H01L 21/02118* (2013.01); *H01L 23/60* (2013.01); *H01L 27/0248* (2013.01); *C03C 2218/111* (2013.01); *C03C 2218/365* (2013.01); *H01L 27/1218* (2013.01)

(56) References Cited

U.S. PATENT DOCUMENTS

| | | | |
|---|---|---|---|
| 4,102,664 | A | 7/1978 | Dumbaugh, Jr. |
| 4,214,886 | A | 7/1980 | Shay et al. |
| 4,880,453 | A | 11/1989 | Coppola et al. |
| 5,119,258 | A | 6/1992 | Tsai et al. |
| 5,792,327 | A | 8/1998 | Belscher et al. |
| 5,985,700 | A | 11/1999 | Moore |
| 6,099,971 | A | 8/2000 | Faris et al. |
| 6,350,506 | B2 | 2/2002 | Dickinson, Jr. |
| 6,818,308 | B2 | 11/2004 | Kase et al. |
| 7,666,508 | B2 | 2/2010 | Feng et al. |
| 2002/0058147 | A1* | 5/2002 | Taruishi .................. C03C 17/30 428/447 |
| 2005/0001201 | A1 | 1/2005 | Bocko et al. |
| 2007/0116913 | A1 | 5/2007 | Kimura et al. |
| 2009/0294761 | A1* | 12/2009 | Kim ...................... H01L 51/424 257/40 |
| 2011/0124153 | A1* | 5/2011 | Hosoba ............. H01L 21/02554 438/104 |
| 2012/0058306 | A1* | 3/2012 | Miwa ..................... C03C 3/091 428/141 |
| 2013/0052414 | A1 | 2/2013 | Dobbins et al. |
| 2013/0306995 | A1 | 11/2013 | Park |
| 2013/0323463 | A1 | 12/2013 | Geremew et al. |
| 2013/0323468 | A1 | 12/2013 | Myers et al. |

OTHER PUBLICATIONS

"Controlling the Kinetics of Contact Electrification with Patterned Surfaces" Samuel W. Thomas III, Sarah J. Vella, Michael D. Dickey, George K. Kaufman, and George M. Whitesides Journal of the American Chemical Society, 2009, 131, 8746-8747.

"A Tool for Studying Contact Electrification in Systems Comprising Metals and Insulating Polymers", Anal. Chem. 2003, 75, 4859-4867.

"Effects of Surface Modification and Moisture on the Rates of Charge Transfer between Metals and Organic Materials" J. Phys. Chem. B. 2004, 108, 20296-20302.

* cited by examiner

ORGANIC SURFACE TREATMENTS FOR DISPLAY GLASSES TO REDUCE ESD

CROSS-REFERENCE TO RELATED APPLICATIONS

This application claims the benefit of priority under U.S.C. § 371 of International Patent Application Serial No. PCT/US15/44226, filed on Aug. 7, 2015, which in turn, claims the benefit of priority of U.S. Provisional Patent Application Ser. No. 62/036,166, filed on Aug. 12, 2014, the contents of each of which are relied upon and incorporated herein by reference in their entireties.

BACKGROUND

In the liquid crystal display field, thin film transistors (TFTs) based on poly-crystalline silicon are preferred because of their ability to transport electrons more effectively. Poly-crystalline based silicon transistors (p-Si) are characterized as having a higher mobility than those based on amorphous-silicon based transistors (a-Si). This allows the manufacture of smaller and faster transistors, which ultimately produces brighter and faster displays.

Flat Panel Display (FPD) glass consists of two sides, a functional side upon which TFT devices are fabricated (A-side) and a non-functional backside (B-side). Typically, the focus is on the high quality A-side because of the sensitivity in fabricating TFT structures over large areas. Noticeably, the B-side contacts a variety of materials (i.e. metals, plastics, rubbers, ceramics, etc.) during processing, in which triboelectrification, or contact electrification due to the friction between two dissimilar materials, transfers charges onto the glass surface. In general, two dissimilar materials charge from contact separation due to their differences in intrinsic work function values or the ability to transfer charge based on their Fermi energy levels. As seen in Equation 1, the more charge accumulated at a surface, the higher the surface voltage. Moreover, when two charged surfaces separate, similar to a parallel plate capacitor (Equation 2), as the separation distance increases, the capacitance decreases. Plugging the lower capacitance back into Equation 1, again, the surface voltage increases due to the separation of contact materials.

$$V = \frac{Q}{C} \quad (1)$$

where V is surface voltage, Q is charge and C is capacitance.

$$C = \frac{\varepsilon A}{4\pi d} \quad (2)$$

where A is the surface area, $\varepsilon$ is the dielectric constant, and d is the separation distance. Because glass contact separation is unavoidable during TFT-LCD manufacturing, methods to reduce total charge accumulation at the glass surface are needed.

Electrostatic discharge (ESD)-related issues, such as gate and/or line damage, have been reported. It has been suggested to increase B-side surface roughness as a potential surface attribute that reduces triboelectrification. As a result, new technologies have been developed for the modification of the B-side in order to improve ESD-related performance.

As glass sheets get larger and thinner, the potential for higher charge generation increases. Furthermore, roll-to-roll manufacturing of ultra-thin (<0.3 mm) glass also present substantial challenges for electrostatic charge generation.

Therefore, there is a need in the art for glass and methods of manufacturing glass with a reduction in total charge accumulation at the glass surface.

SUMMARY

Aspects of the invention are directed to display glass substrates comprising an A-side upon which silicon thin film transistor devices can be fabricated and a B-side having a substantially homogeneous organic film thereon. The organic film includes a moiety that reduces voltage generation by contact electrification or triboelectrification. The display glass comprises boroaluminosilicate and has a density less than 2.45 g/cm$^3$.

Additional embodiments of the invention are directed to methods of making display glass substrates by a float process, a casting process, a downdraw process such as a fusion downdraw process or a slot downdraw process.

Further embodiments of the invention are directed to methods of manufacturing a display glass article. A glass substrate comprising an A-side and a B-side is formed, the A-side upon which electronic devices can be fabricated, the glass substrate comprising boroaluminosilicate and having a density less than 2.45 g/cm$^3$. A substantially homogeneous organic film is formed on the B-side of the glass substrate. The organic film includes a moiety that reduces voltage generation by contact electrification or triboelectrification.

Additional embodiments of the invention are directed to method of making top gated thin film transistors directly onto boroaluminosilicate glass substrates. A glass having an A-side upon which the transistors can be formed and a B-side opposite the A-side is provided where the B-side including an organic film thereon. A silicon coating is formed directly onto the A-side. The silicon coating is patterned to form a base of the thin film transistor. Fabrication steps necessary to fabricate the thin film transistor are continued.

BRIEF DESCRIPTION OF THE DRAWINGS

The accompanying figures, which are incorporated in and constitute a part of this specification, illustrate several aspects described below.

DETAILED DESCRIPTION

Figure 1:
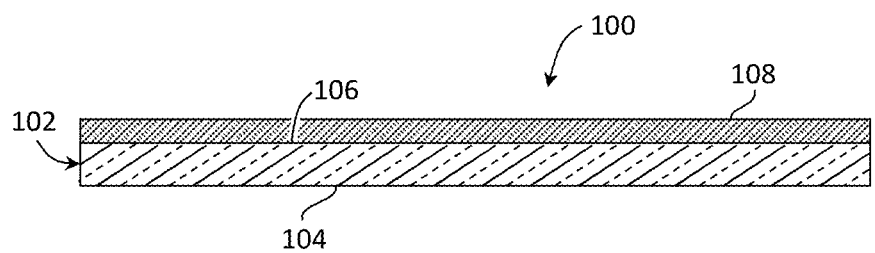
FIGS. 1 and 2 are cross-sectional views of exemplary glass articles comprising a glass substrate with an organic film, and a glass substrate with an organic film and a silicon coating, respectively, in accordance with one or more embodiments of the disclosure.

Embodiments of the disclosure are directed to methods of treating the B-side surface of glass sheets of any size or thickness that has been formed by any common manufacturing process (e.g., fusion, float, slot-draw, downdraw etc.) with organic chemistry. This treatment of the B-side glass surface has a minimal effect on the A-side superior surface performance attributes. Treating the B-side glass surface in accordance with embodiments of the disclosure decreases electrostatic charging events during contact conveyance, handling, and separation, while additionally improving customer transfer equipment life-time by lowering the coefficient of friction between materials and extending wear-resistance. Electrostatic charging on the B-side of a flat panel display (FPD) glass used for TFT backplane substrates may cause problems on the A-side, such as gate damage, via electrostatic discharge (ESD) dielectric breakdown, and/or the attraction of particles that contaminate the surface, which in turn causes lower yields during the TFT-LCD manufacturing process.

One such technology that has been developed to reduce ESD is acid etching of the B-side to increase roughness of the glass surface, thereby reducing contact area between the B-side glass and various materials in the customer's process. Particular acid chemistry comprising a mixture of NaF, $H_3PO_4$, and water has been developed for this purpose. Treatment of the B-side of flat panel display-type glasses with this mixture have demonstrated increased average surface roughness, $R_a$, from about 0.2 nm (as-formed fusion-drawn glass) to 1.0 nm or more. It has also been demonstrated that some glass roughens at a much faster rate and achieves higher $R_a$ values during treatment than other glass. Without being bound by any particular theory of operation, it is believed that this is due to differences in bulk and surface glass composition. Etching with the $NaF/H_3PO_4$ chemistry not only roughens the glass surface, but also modifies the surface chemical composition (e.g., increases Si/Al atomic ratio). Surface chemistry plays an additional role in defining surface resistivity or other electronic properties that may affect electrostatic charging behavior.

Embodiments of the disclosure are directed to methods comprising the deposition of an organic film onto the B-side glass surface to reduce the coefficient of friction between the glass and other materials contacted during handling and processing. Additionally, the organic surface treatment can dissipate static charge and thereby minimize or eliminate triobelectrification and electrostatic discharge events. The organic surface treatment may also neutralize the anionic (negatively charged) character of the glass surface (e.g., zeta potential), especially in neutral or basic environments. Organics with some cationic character may even be more effective in charge neutralization, but could also impart a positive charge to the glass surface. This treatment can be applied to any glass composition of any geometry by a variety of application methods common in the art (e.g., liquid, vapor, etc.).

Some embodiments of the disclosure provide a surface treatment to reduce electrostatic charging more effectively than what is currently achieved by surface roughening via acid etching or other such topographical modification. One or more embodiments of the disclosure can be deposited on large glass sheets on the "B" side without affecting the "A" side. In some embodiments, surface treatment with organics is less expensive than acid etching due to shorter processing times required for application to a glass sheet.

Referring to FIG. 1, according to some aspects of the disclosure, a display glass article 100 comprising a glass substrate 102 comprising an A-side 104 upon which silicon thin film transistor devices can be fabricated and a B-side 106 having a substantially homogeneous organic film 108 thereon are shown and described. The organic film 108 includes a moiety that reduces voltage generation by contact electrification or triboelectrification. As used in this disclosure and the appended claims, the term "substantially homogeneous" used in this context means that the distribution of molecules across the surface is random without discrete domains of coated and uncoated regions.

Additional aspects of the disclosure are directed to methods of manufacturing the display glass article 100. The glass substrate 102 comprising the A-side 104 and the B-side 106 is prepared. The A-side 104 of the glass substrate has a suitable surface upon which electronic devices can be fabricated. The substantially homogeneous organic film 108 is formed on the B-side 106 of the glass substrate 102. The organic film 108 includes a moiety that reduces voltage generation by contact electrification or triboelectrification.

Figure 2:
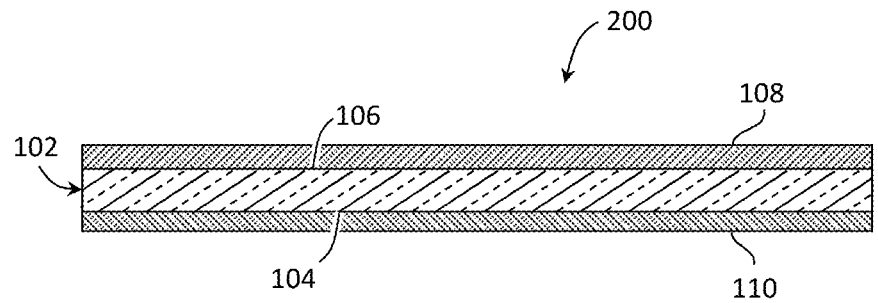

Further aspects of the disclosure are directed to methods of making top gated thin film transistors directly on glass substrates. In accordance with FIG. 2, a glass article 200 comprising the glass substrate 102 having an A-side 104 upon which the transistors can be formed and a B-side 106 opposite the A-side is provided. The B-side 106 includes an organic film 108 thereon. A silicon coating 110 is formed directly onto the A-side 104. The silicon coating 110 is patterned to form a base of the thin film transistor. Fabrication steps necessary to fabricate the thin film transistor are continued.

Display glass substrate 102 can have various compositions and can be formed by different processes. Suitable formation processes include, but are not limited to float processes and downdraw processes such as slot-draw and fusion draw processes. See, for example, U.S. Pat. Nos. 3,338,696 and 3,682,609. In the slot-draw and fusion draw processes, the newly-formed glass sheet is oriented in a vertical direction. One glass substrate, Lotus™, manufactured by Corning, Inc., has a small coefficient of thermal expansion and is superior in dimensional stability and workability at relatively high processing temperatures. Lotus™ glass contains little, if any, alkali components in the glass.

Suitable glass display substrates include high performance glass substrates manufactured by Corning, Inc. The glass substrates are specifically designed to be used in the manufacture of flat panel displays and exhibit densities of less than 2.45 g/cm³ and a liquidus viscosity (defined as the viscosity of the glass at the liquidus temperature) greater than about 200,000 poises, or greater than about 400,000 poises, or greater than about 600,000 poises, or greater than about 800,000 poises. Additionally, suitable glass substrates exhibit substantially linear coefficients of thermal expansion over the temperature range of 0° to 300° C. of $28–35\times10^{-7}$/° C., or of $28–33\times10^{-7}$/° C., and strain points higher than about 650° C. As used in this specification and the appended claims, the term "substantially linear" means that the linear regression of data points across the specified range has a coefficient of determination greater than or equal to about 0.9, or greater than or equal to about 0.95, or greater than or equal to about 0.98 or greater than or equal to about 0.99, or greater than or equal to about 0.995. Suitable glass substrates include those with a melting temperature less than 1700° C. In addition, suitable glass substrates exhibit a weight loss of less than 0.5 mg/cm² after immersion in a solution of 1 part HF (50 wt. %) and 10 parts $NH_4F$ (40 wt. %) for 5 minutes at 30° C.

In one embodiment of the described process, the glass substrate has a composition in which the major components of the glass are $SiO_2$, $Al_2O_3$, $B_2O_3$, and at least two alkaline earth oxides. Suitable alkaline earth oxides include, but are not limited to MgO, BaO and CaO. The $SiO_2$ serves as the basic glass former of the glass and has a concentration greater than or equal to about 64 mole percent in order to provide the glass with a density and chemical durability suitable for a flat panel display glass, e.g., a glass suitable for use in an active matrix liquid crystal display panel (AM-LCD), and a liquidus temperature (liquidus viscosity) which allows the glass to be formed by a downdraw process (e.g., a fusion process) described in more detail below. Suitable glass substrates have a density less than or equal to about 2.45 grams/cm$^3$, or less than or equal to about 2.41 grams/cm$^3$, a weight loss which is less than or equal to about 0.8 milligrams/cm$^2$ when a polished sample is exposed to a 5% HCl solution for 24 hours at 95° C., and a weight loss of less than 1.5 milligrams/cm$^2$ when exposed to a solution of 1 volume of 50 wt. % HF and 10 volumes 40 wt. % NH$_4$F at 30° C. for 5 minutes.

Suitable glass for use with embodiments of the present disclosure have an SiO$_2$ concentration less than or equal to about 71 mole percent to allow batch materials to be melted using conventional, high volume melting techniques, e.g., Joule melting in a refractory melter. In detailed embodiments, the SiO$_2$ concentration is in the range from about 66.0 to about 70.5 mole percent, or in the range from about 66.5 to about 70.0 mole percent, or in the range from about 67.0 to about 69.5 mole percent. As a result of the SiO$_2$ content, suitable glasses typically have melting temperatures greater than or equal to about 1600° C.

Aluminum oxide (Al$_2$O$_3$) is another glass former suitable for use with embodiments of the disclosure. Without being bound by any particular theory of operation, it is believed that an Al$_2$O$_3$ concentration greater than or equal to about 9.0 mole percent provides a glass with a low liquidus temperature and a corresponding high liquidus viscosity. The use of at least about 9.0 mole percent Al$_2$O$_3$ also improves the strain point and the modulus of the glass. In detailed embodiments, the Al$_2$O$_3$ concentration is in the range from about 9.5 to about 11.5 mole percent.

Boron oxide (B$_2$O$_3$) is both a glass former and a flux that aids melting and lowers the melting temperature. To achieve these effects, glasses for use with embodiments of the present disclosure have B$_2$O$_3$ concentrations that are equal to or greater than about 7.0 mole percent. Large amounts of B$_2$O$_3$, however, lead to reductions in strain point (approximately 10° C. for each mole percent increase in B$_2$O$_3$ above 7.0 mole percent), modulus, and chemical durability.

Suitable glass substrates have a strain point equal to or greater than about 650° C., equal to or greater than about 655° C., or equal to or greater than about 660° C., a Young's modulus equal to or greater than 10.0×10$^6$ psi, and a chemical durability as described above in connection with the discussion of the SiO$_2$ content of the glass. Without being bound by any particular theory of operation, it is believed that a high strain point may help prevent panel distortion due to compaction/shrinkage during thermal processing subsequent to manufacturing of the glass. Without being bound by any particular theory of operation, it is believed that a high Young's modulus may reduce the amount of sag exhibited by large glass sheets during shipping and handling.

In addition to the glass formers (SiO$_2$, Al$_2$O$_3$, and B$_2$O$_3$), suitable glass substrates may also include at least two alkaline earth oxides, i.e., at least MgO and CaO, and, optionally, SrO and/or BaO. Without being bound by any particular theory of operation, it is believed that the alkaline earth oxides provide the glass with various properties important to melting, fining, forming, and ultimate use. In some embodiments, the MgO concentration is greater than or equal to about 1.0 mole percent. In detailed embodiments, the MgO concentration is in the range of about 1.6 and about 2.4 mole percent.

Of the alkaline earth oxides, the CaO concentration of some embodiments of the glass substrate is the largest. Without being bound by any particular theory of operation, it is believed that CaO produces low liquidus temperatures (high liquidus viscosities), high strain points and moduli, and coefficients of thermal expansion (CTE's) in the most desired ranges for flat panel applications, specifically, AMLCD applications. It is also believed that CaO contributes favorably to chemical durability, and compared to other alkaline earth oxides, CaO is relatively inexpensive as a batch material. Accordingly, in some embodiments, the CaO concentration is greater than or equal to about 6.0 mole percent. In specific embodiments, the CaO concentration in the display glass is less than or equal to about 11.5 mole percent, or in the range of about 6.5 and about 10.5 mole percent.

The glass substrate described in the process can be what is referred to in the art as laminated glass. In one aspect, the display glass substrate is produced by fusion drawing a glass skin to at least one exposed surface of a glass core. Generally, the glass skin will possess a strain point equal to or greater than 650° C. In some embodiments, the skin glass composition has a strain point equal to or greater than 670° C., equal to or greater than 690° C., equal to or greater than 710° C., equal to or greater than 730° C., equal to or greater than 750° C., equal to or greater than 770° C., or equal to or greater than 790° C. The strain point of the disclosed compositions can be determined by one of ordinary skill in the art using known techniques. For example, the strain point can be determined using ASTM method C336.

In some embodiments, the glass skin can be applied to an exposed surface of a glass core by a fusion process. An example of a suitable fusion process is disclosed in U.S. Pat. No. 4,214,886, which is incorporated by reference herein in its entirety. The fusion glass substrate forming process can be summarized as follows. At least two glasses of different compositions (e.g., the base or core glass sheet and the skin) are separately melted. Each of the glasses is then delivered through an appropriate delivery system to a respective overflow distributor. The distributors are mounted one above the other so that the glass from each flows over top edge portions of the distributor and down at least one side to form a uniform flow layer of appropriate thickness on one or both sides of the distributor. The molten glass overflowing the lower distributor flows downwardly along the distributor walls and forms an initial glass flow layer adjacent to the converging outer surfaces of the bottom distributer. Likewise, molten glass overflowing from the upper distributor flows downwardly over the upper distributor walls and flows over an outer surface of the initial glass flow layer. The two individual layers of glass from the two distributers are brought together and fused at the draw line formed where the converging surfaces of the lower distributor meet to form a single continuously laminated ribbon of glass. The central glass in a two-glass laminate is called the core glass, whereas the glass positioned on the external surface of the core glass is called the skin glass. A skin glass can be positioned on each surface of the core glass, or there may be only one skin glass layer positioned on a single side of the core glass. When just one skin glass is fused directly to the core, the skin is "adjacent" to the core.

The overflow distributor process provides a fire polished surface to the glass ribbon so formed, and the uniformly distributed thickness of the glass ribbon provided by the controlled distributor(s), and the glass sheets cut therefrom, provides the glass sheets with superior optical quality. The glass sheets used as display glass substrates can have a thickness in the range of 100 micrometers (μm) to about 0.7 μm, but other glass sheets that may benefit from the methods described herein may have a thickness in a range from about 10 μm to about 5 mm. Other fusion processes, which can be used in the methods disclosed herein, are described in U.S. Pat. Nos. 3,338,696, 3,682,609, 4,102,664, 4,880,453, and U.S. Published Application No. 2005/0001201, which are incorporated by reference herein in their entireties. The fusion manufacturing process offers advantages for the display industry, including glass that is flat with excellent thickness control and glass that has a pristine surface quality and scalability. Glass substrate flatness can be important in the production of panels for liquid crystal display (LCD) televisions as any deviations from flatness can result in visual distortions.

In some embodiments, the glass substrate will possess a strain point equal to or greater than 640° C., CTEs in the range from about $31 \times 10^{-7}$/° C. to about $57 \times 10^{-7}$/° C., a weight loss less than 20 mg/cm$^2$ after immersion for 24 hours in an aqueous 5% by weight HCl solution at about 95° C., that is nominally free from alkali metal oxides and has a composition, calculated in weight percent on the oxide basis, comprising about 49 to 67% $SiO_2$, at least about 6% $Al_2O_3$, $SiO_2+Al_2O_3>68\%$, $B_2O_3$ in a range from about 0% to about 15%, at least one alkaline earth metal oxide selected from the group consisting of, in the preparations indicated, about 0 to 21% BaO, about 0 to 15% SrO, about 0 to 18% CaO, about 0 to 8% MgO and about 12 to 30% BaO+CaO+SrO+MgO.

The organic film formed on the B-side of the display glass can be any suitable organic film. As used in this specification and the appended claims, the terms "formed", "deposited" and the like, are used interchangeably with respect to the formation of an organic film. The organic film comprises a compound selected from the group consisting of (1) an organic compound that substantially reduces the hydrophilic character of the B-side; (2) an organic compound containing an amine group or other cationic group that can be protonated; (3) an organic compound that reduces the display glass substrate B-side surface coefficient of friction; (4) an organic compound that comprises an organosilane that increases an amount of surface electron mobility; and (5) an organic film that demonstrates any combination of the characteristics of (1) through (4).

In some embodiments, the organic film comprises a log chain alkyl group having at least two carbons. The long chain alkyl group can be terminated by any element that can form a film on the glass surface or can be terminated by any suitable functional group. The film can be formed by any suitable chemical or physical reaction including, but not limited to, chemisorption. The length of the alkyl group in some embodiments is greater than or equal to 3, 4, 5, 6, 7, 8, 9, 10, 11, 12, 13, 14, 15, 16, 17, 18, 19 or 20 carbons. The length of the alkyl group in one or more embodiments is in the range of about 2 carbons to about 34 carbons, or in the range of about 4 carbons to about 32 carbons, or in the range of about 6 carbons to about 30 carbons, or in the range of about 8 carbons to about 28 carbons, or in the range of about 10 carbons to about 26 carbons, or in the range of about 12 carbons to about 24 carbons, or in the range of about 14 carbons to about 22 carbons or in the range of about 16 carbons to about 20 carbons. In some embodiments, the organic film comprises an organic polymer.

In one or more embodiments, the organic film comprises an amine. The amine can be a functional group terminating an alkane, alkene, alkyne or aryl constituent. The amine can act as a coupling agent (i.e., positioned at the site of binding to the glass surface) or can be at the opposite end of the molecule from the binding site. In some embodiments, the organic film comprises a silane coupling agent. The silane can terminated by, for example, an alkyl chain, an alkyl ammonium-terminated chain, or an aromatic-terminated chain. In some embodiments, the organic film comprises an aromatic ring that provides mobile electrons. Suitable examples of aromatic rings include, but are not limited to, phenyl rings.

In detailed embodiments, the organic film comprises one or more of an alkyl ammonium-terminated silane coupling agent having an alkyl group with a length greater than or equal to two carbons, an aromatic compound or a long chain alkyl group with a length greater than or equal to two carbons.

Suitable organic films include, but are not limited to, gamma-3-aminopropyltriethoxysilane (GAPS), octadecanol, phenylsilane, poly(allylamine) and octadecyldimethyl (3-trimethoxysilylpropyl)ammonium chloride.

The organic film can be deposited onto the B-side of the glass using any suitable method including, but not limited to, wet chemical processes, physical vapor deposition and chemical vapor deposition. In some embodiments, the organic film is deposited onto the surface during an aqueous washing process. The aqueous washing process that deposits the organic film can be incorporated into the glass preparation or can replace an existing washing step. In some embodiments, the organic film is deposited onto the B-side of the glass during one or more of a chemical vapor deposition (CVD) or plasma vapor deposition (PVD) process.

According to some embodiments, the organic film coated display glass exhibits a change in functional characteristics. Characteristics that can be altered by the organic film include, but are not limited to, surface resistivity, zeta potential, coefficient of friction and water contact angle.

Bare display glasses (alkali-free) typically have surface resistivities in the $10^{-17}$ to $10^{-18}$ Ohm/sq. range. In some embodiments, the log of surface resistivity of the organic film coated glass is equal to or less than about 17.5 Ohm/square, equal to or less than about 17 Ohm/square, equal to or less than about 16.5 Ohm/square, equal to or less than about 16 Ohm/square, equal to or less than about 15.5 Ohm/square, equal to or less than about 15 Ohm/square, equal to or less than about 14.5 Ohm/square, equal to or less than about 14 Ohm/square, or equal to or less than about 13.5 Ohm/square. The surface resistivity values are measured at all relative humidities greater than or equal to about 10%. In some embodiments, the organic film reduces the surface resistivity by at least about 1 order of magnitude, or at least about 0.9 orders of magnitude, or at least about 0.8 orders of magnitude, or at least about 0.7 orders of magnitude, or at least about 0.6 orders of magnitude relative to the uncoated (i.e., untreated) glass.

Display glasses are generally anionic (negatively charged) over a broad pH range and have a zeta potential of approximately −80 to −120 millivolts (mV) in the neutral to basic pH range (as determined by measuring the streaming potential of glass plates in an electrolyte solution). Organic surface treatments in accordance with embodiments of the disclosure generally reduce the zeta potential of the glass surface and render it less anionic. In some embodiments, the zeta potential is reduced to about 0 mV, or even slightly positive (up to about +40 mV) at a neutral pH. In one or more embodiments, the B-side of the organic coated glass has a zeta potential measured with a 20 mM KCl electrode in the range of about −30 mV to about 40 mV at neutral pH at room temperature. In some embodiments, the B-side zeta potential measured under the same conditions, is in the range of about −20 mV to about 30 mV, or in the range of about −15 mV to about 25 mV, or in the range of about −10 mV to about 20 mV, or in the range of about −5 mV to about 15 mV, or in the range of about −5 mV to about 10 mV, or in the range of about −5 mV to about 5 mV or about 0 mV, where the zeta potential is measured with 20 mM KCl electrode at neutral pH and at room temperature.

In some embodiments, the organic film coated B-side has a coefficient of friction at least about 20%, 15%, 10% or 5% less than an equivalent glass without the organic film measured at 25 nN at room temperature using a sapphire ball. In one or more embodiments, the organic film coated glass has a coefficient of friction less than about 0.35, 0.3, 0.25 or 0.2 measured with a normal force of 25 nano-Newtons (nN) at room temperature using a sapphire ball. In some embodiments, the organic film coated glass has a coefficient of friction less than about 0.3, 0.25, 0.2 or 0.15 measured at 50 nN at room temperature using a sapphire ball. In some embodiments, the organic film coated glass has a coefficient of friction less than about 0.25, 0.2, 0.15 or 0.1 measured at 100 nN at room temperature using a sapphire ball.

In some embodiments, the organic coated B-side of the display glass has a water contact angle equal to or greater than about 20, equal to or greater than about 25 or equal to or greater than about 30 degrees.

EXAMPLES

The following examples are set forth below to illustrate exemplary embodiments. These examples are not intended to be inclusive of all embodiments of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, temperature is in ° C. or is at ambient temperature, and pressure is at or near atmospheric. The compositions themselves are given in weight percent on an oxide basis and have been normalized to 100%. There are numerous variations and combinations of reaction conditions, e.g., component concentrations, temperatures, pressures and other reaction ranges and conditions that can be used to optimize the product purity and yield obtained from the described process. Only reasonable and routine experimentation will be required to optimize such process conditions.

Modification of a display glass surface chemistry by deposition of organic materials was demonstrated to significantly reduce electrostatic charging during contact separation. In these examples, the organic surface treatments were applied to Lotus™ glass with dimensions of 230 mm×180 mm×0.5 mm.

The following organic surface treatments were investigated: octadecanol, C18 Y-SAM (octadecyldimethyl(3-trimethoxysilylpropyl)ammonium chloride), polyallylamine, GAPS (gamma-3-aminopropyltriethoxysilane), and phenylsilane. All glass pieces were washed on the same day in a washer utilizing 4% SemiClean KG alkaline detergent. All glass pieces were stored inside a clean room (particle and molecular filtration) under a unidirectional flow HEPA filter at all times, except during treatment with the organic materials. During electrostatic charge measurements by contact separation, a stainless steel vacuum table was cleaned with HPLC grade IPA followed by HPLC grade DI water and allowed to acclimate for one hour before testing the next coating to remove any residual organic materials from the previous test.

The wash description is shown in Table 1. The bath temperatures were all 160° F. in the washer.

TABLE 1

Glass Washing Steps

| Step | Description |
|---|---|
| 1 | Rinse shower - 678 seconds, DI water only |
| 2 | Detergent bath - 720 seconds, 4% Semiclean* |
| 3 | Rinse shower - 720 seconds, DI water only |
| 4 | Rinse bath - 720 seconds, DI water only* |
| 5 | Slow pull bath - 720 seconds, DI water only |
| 6 | Hot air dry - 720 seconds |

*Indicates a step which includes the use of ultrasonic vibration. Frequencies vary by machine.

Comparative A—Glass

A clean piece of as-formed glass served as a control.

Comparative B—Dilute Washed Glass

A piece of Comparative A glass was washed in a dilute solution of sodium fluoride (NaF) and phosphoric acid ($H_3PO_4$) in water. After washing, the glass sheets were returned to the clean room and allowed to acclimate for at least 12 hours prior to testing.

Sample A—Gamma-3-aminopropyltriethoxysilane (GAPS or APTES)

A 1% solution of GAPS was prepared in water pre-acidified to a pH of 4.0 with acetic acid. The acidic solution was stirred for 30 minutes to fully hydrolyze the silane. The solution was poured onto a polypropylene tray into which pre-washed sheets of glass were dipped for 15 seconds. The treated glass sheets were then rinsed with copious amounts of DI water to remove any excess organic material, and finally dried in an oven for 3 hours at 100° C. The treated glass sheets were then returned to the clean room and allowed to acclimate for at least 12 hours prior to testing.

Sample B—Octadecanol

Reagent grade octadecanol pellets were placed inside a Petri® dish and heated to 90° C. After the octadecanol pellets had melted and reached the desired temperature, pre-washed sheets of glass were placed on top of the Petri® dish for ten seconds, so that only the B-side was treated. After treatment, the glass sheets were returned to the clean room and allowed to condition for at least 12 hours prior to testing.

Sample C—Phenylsilane

A 1% solution of phenylsilane was prepared in toluene. The solution was poured onto a polypropylene tray into which pre-washed sheets of glass were dipped for 15 seconds. The treated sheets were then allowed to air dry and then returned to the clean room and allowed to acclimate for at least 12 hours prior to testing.

Sample D—Poly(allylamine)

Reagent grade poly(allylamine hydrochloride) was dissolved in water at a concentration of 1 wt % and stirred for 30 minutes. Pre-washed sheets of glass were placed in a spin-coater and the poly(allylamine) solution was added to the B-side until the whole surface was completely covered. The spin-coater was set to 1000 rpm, ramp of 1 rpm/second, and the spin-time was 60 seconds. The treated glass sheets were then returned to the clean room and allowed to acclimate for at least 12 hours prior to testing.

Sample E—C18 YSAM

A 1% solution of octadecyldimethyl(3-trimethoxysilyl-propyl)ammonium chloride (C18 YSAM) was prepared in water pre-acidified to a pH of 4.0 with acetic acid. The acidic solution was stirred for 30 minutes to fully hydrolyze the silane. The solution was poured onto a polypropylene tray into which pre-washed sheets of glass were dipped for 15 seconds. The treated glass sheets were then rinsed with copious amounts of DI water to remove any excess organic material, followed by blow dry with $N_2$ gas. The treated glass sheets were then returned to the clean room and allowed to acclimate for at least 12 hours prior to testing.

Test Method

A lift tester—a device that simulates equipment used by many TFT device fabricators—consisting of a stainless steel table with multiple vacuum ports and the capability of replicating contact separation electrification was used for testing. A series of fieldmeter probes were measure the electric field lines originating from a charged surface, which are reported as a surface voltage. The lift tester was housed inside a clean room equipped with humidity control and molecular HEPA filters.

Voltage generation for glass surfaces with and without various surface treatments with organic materials was measured by contact separation of a glass sheet from a stainless steel vacuum table. Voltage generation during contact separation was measured for as-formed (Comparative A) and washed glass samples (Comparative B) and compared to voltage generation for Samples A through E. The samples were tested at room temperature with a relative humidity of 13%. The results of this testing are collected in Table 2. The % voltage reduction for each organic surface treatment is plotted relative to the as-formed, untreated glass surface.

TABLE 2

| Glass Voltage | | |
|---|---|---|
| Glass | Absolute Voltage (kV) | % Voltage Reduction |
| Comparative A | −0.24 | 0% |
| Comparative B | −0.22 | 8.0% |
| A | 0.10 | * |
| B | −0.01 | 96.2% |
| C | −0.06 | 75.1% |
| D | −0.04 | 84.0% |
| E | −0.11 | 53.2% |

* The voltage was positive indicating an effective voltage reduction of 100%.

The surface resistivity of the as-formed/untreated and C18 YSAM treated glass surfaces (Sample E) as a function of relative humidity was measured. Surface resistivity measurements were executed as a function of increasing test environment relative humidity using laboratory prepared fired gold concentric ring electrodes applied to test glass surfaces. The surface resistivity of both glass surfaces decreased with increasing relative humidity, but the Y-SAM treated surface was 1-2 orders of magnitude more electrically conductive than the untreated glass surface. The results are collected in Table 3.

TABLE 3

| Log of Surface Resistivity (Ohm/square) vs. Humidity | | | |
|---|---|---|---|
| Glass | 13% RH | 40% RH | 65% RH |
| Comparative A | 17.7 | 15.4 | 12.8 |
| E | 16.0 | 13.9 | 12.4 |

The water contact angle was measured for each sample. The contact angle results are collected in Table 4. It can be seen that the organic surface coating increases the water contact angle relative to the as-drawn glass.

TABLE 4

| Contact Angle Measurements | |
|---|---|
| Glass | Average WCA (degrees) |
| Comparative A | <10 |
| A | 48 |
| B | 100 |
| C | 74 |
| D | 32 |
| E | 68 |

Figure 3:
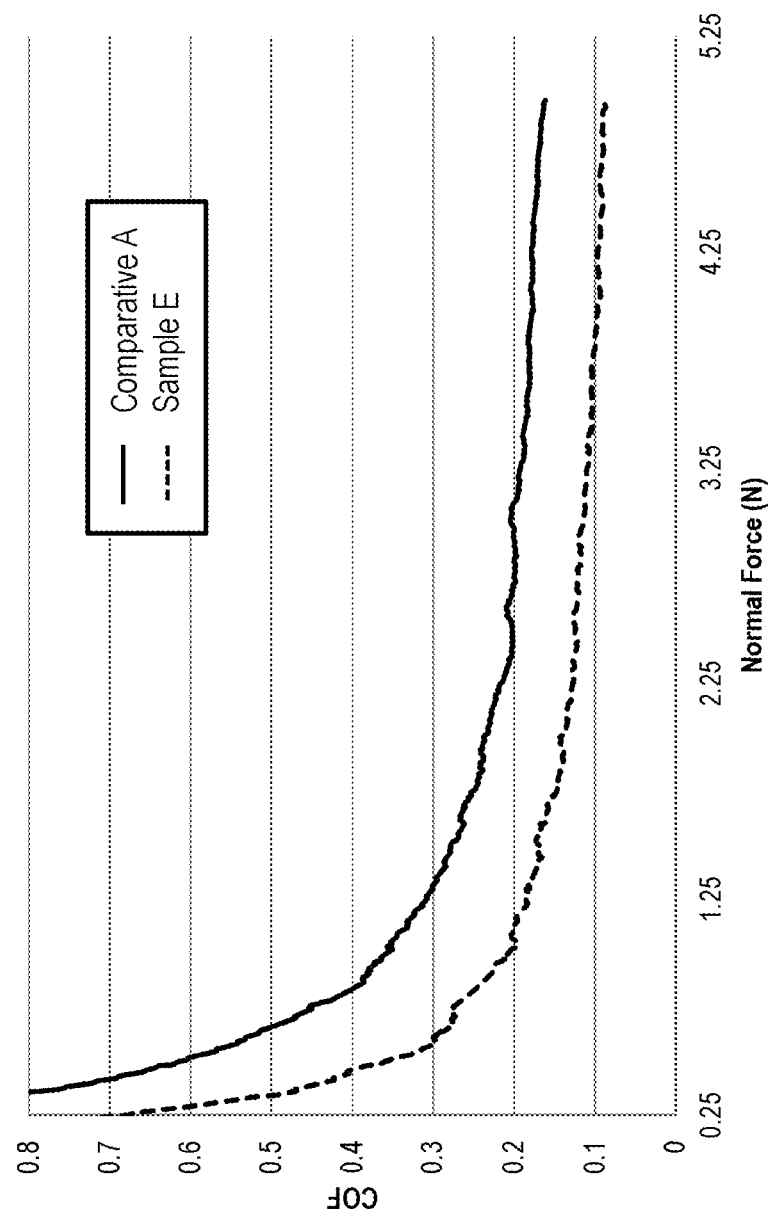
FIGS. 3 and 4 are graphs of the coefficient of friction as a function of normal force for untreated and surface treated glass samples, and for untreated and surface treated glass samples prepared at different temperatures in accordance with one or more embodiments of the disclosure.

The coefficient of friction was measured for the untreated and C18 YSAM surface treated (Sample E) glass samples. The samples were tested using a 0.25" diameter nylon ball. FIG. 3 shows a graph of the coefficient of friction as a function of the normal force (N). It can be seen that the treated surface had a lower COF than the untreated glass.

Figure 4:
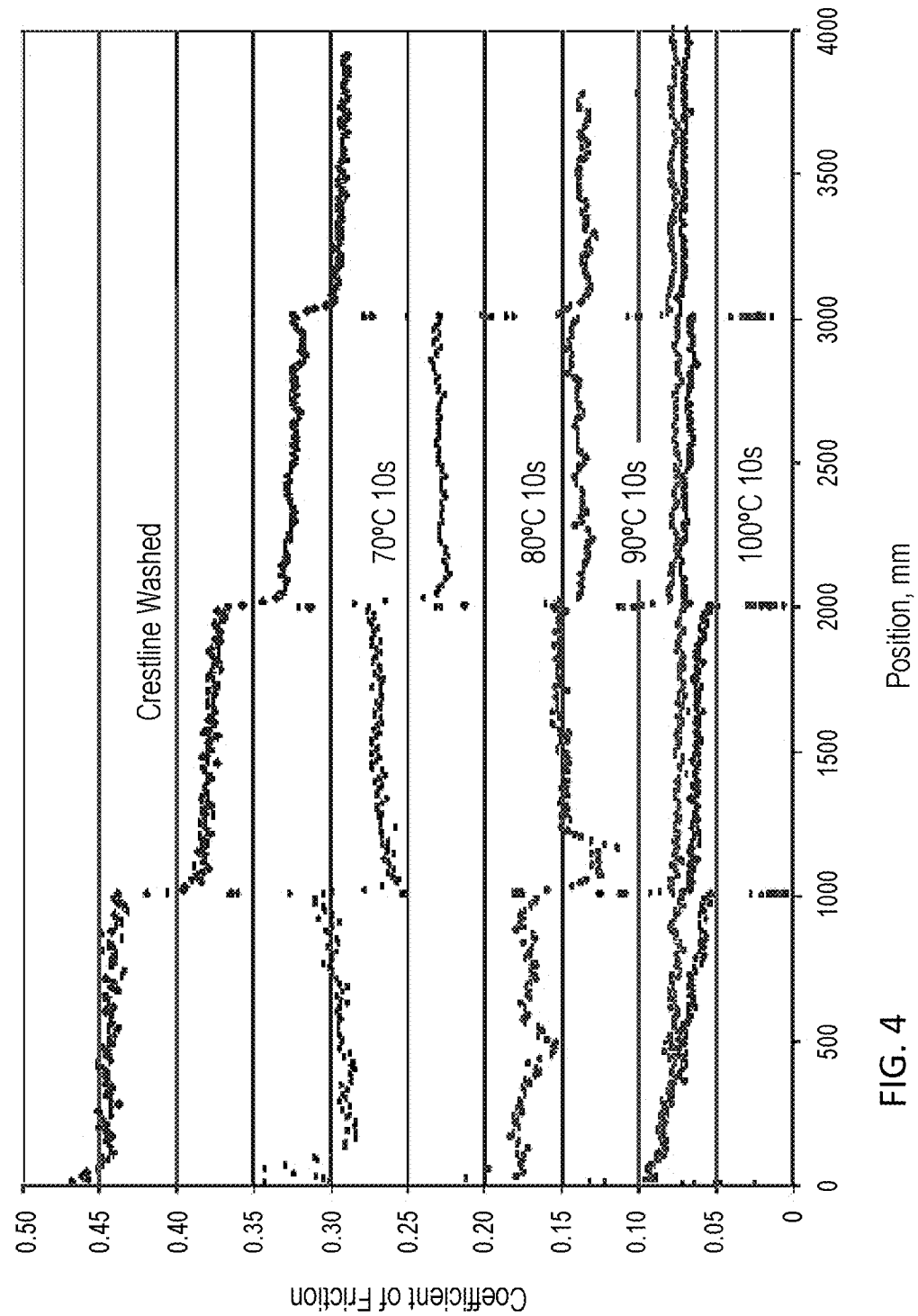

The coefficient of friction measurements for glass with and without octadecanol surface treatment was also measured. Octadecanol was evaporated onto the glass surface from vapor at temperatures ranging from 70° C. to 100° C. for 10 seconds. A sapphire ball was loaded with forces ranging from 25 nN to 150 nN and dragged across the surface. FIG. 4 shows the results of these tests. The coefficient of friction for each sample was less than that of the untreated glass surface.

Treatment of the glass surface by a variety of other organic molecules or combination of organic materials are envisioned to result in similar improvements to electrostatic charging. Any organic material that substantially reduces the hydrophilic character of the glass surface or contains an amine group which can be protonated (or other cationic species) is expected to reduce voltage generation during contact separation. Additionally, any organic material that substantially reduces the glass surface coefficient of friction is expected to reduce triboelectrification during sliding of the glass sheet against another material.

Surface treatments with fluorinated hydrocarbons by methods such as PECVD are also expected to reduce electrostatic charging, as these organic materials increase the hydrophobicity of the glass surface and reduce the coefficient of friction.

Inorganic surface treatments may also reduce electrostatic surface charge, especially those that reduce the resistivity of the glass surface (e.g., various transparent conducting oxide films such as fluorinated tin oxide, indium tin oxide, and the like).

Various modifications and variations can be made to the materials, methods, and articles described herein. Other aspects of the materials, methods, and articles described herein will be apparent from consideration of the specification and practice of the materials, methods, and articles disclosed herein. It is intended that the specification and examples be considered as exemplary.

What is claimed is:

1. A glass substrate comprising:
   an A-side upon which silicon thin film transistor devices can be fabricated;
   a B-side comprising a substantially homogeneous organic film thereon, the organic film including a moiety that reduces voltage generation by contact electrification or triboelectrification; and wherein the glass substrate comprises boroaluminosilicate and has a density less than 2.45 g/cm$^3$ and wherein the organic film is deposited onto the B-side of the glass during an aqueous washing process.

2. The glass substrate of claim 1, wherein the organic film comprises a compound selected from the group consisting of an organic compound that substantially reduces the hydrophilic character of the B-side, an organic compound containing an amine group or other cationic group that can be protonated, an organic compound that reduces the glass substrate B-side surface coefficient of friction, an organic compound that comprising an organosilane that increases an amount of surface electron mobility, and combinations thereof.

3. The glass substrate of claim 1, wherein the organic film contains one or more of a long chain alkyl group having at least two carbons, an amine or an aromatic ring that provides mobile electrons.

4. The glass substrate of claim 1, wherein the organic film comprises one or more of an alkyl ammonium-terminated silane coupling agent having an alkyl group with a length greater than or equal to two carbons, an aromatic compound or a long chain alkyl group with a length greater than or equal to two carbons.

5. The glass substrate of claim 4, wherein the alkyl group length is in a range of about 16 to about 20 carbons.

6. The glass substrate of claim 1, wherein the organic film comprises one or more of 3-aminopropyltriethoxysilane (GAPS), poly(allylamine) or octadecyldimethyl(3-trimethoxysilylpropyl)ammonium chloride.

7. The glass substrate of claim 1, wherein the log of surface resistivity is less than about 16.5 Ohm/square at all relative humidities greater than or equal to about 10%.

8. The glass substrate of claim 1, wherein the B-side has a zeta potential measured with a 20 mM KCl electrode in a range from about −30 mV to about 40 mV at neutral pH at room temperature.

9. The glass substrate of claim 1, wherein the B-side has a coefficient of friction at least about 10% less than an equivalent glass substrate without the organic film measured using a sapphire ball at a normal force of 25 nN at room temperature.

10. The glass substrate of claim 1, wherein the B-side has a water contact angle greater than about 25 degrees.

11. A method of manufacturing a glass article, the method comprising:

forming a glass substrate comprising an A-side and a B-side, the A-side upon which electronic devices can be fabricated, the glass substrate comprising boroaluminosilicate and having a density less than 2.45 g/cm$^3$; and forming a substantially homogeneous organic film on the B-side of the glass substrate while washing the B-side of the glass using a wet chemical process, the organic film including a moiety that reduces voltage generation by contact electrification or triboelectrification.

12. A method of making top gated thin film transistors directly onto boroaluminosilicate glass substrates, the method comprising:

providing a glass substrate comprising an A-side upon which the transistors can be formed and a B-side opposite the A-side, the B-side including an organic film deposited thereon during an aqueous washing step, the organic film including a moiety that reduces voltage generation by contact electrification or triboelectrification;

forming a silicon coating directly onto the A-side;

patterning the silicon coating to form a base of the thin film transistor; and continuing fabrication steps necessary to fabricate the thin film transistor.

13. The method of claim 12, wherein the organic film comprises a compound selected from the group consisting of an organic compound that substantially reduces the hydrophilic character of the B-side, an organic compound containing an amine group or other cationic group that can be protonated, an organic compound that reduces the display glass substrate B-side surface coefficient of friction, an organic compound that comprises an organosilane that increases an amount of surface electron mobility, and combinations thereof.

14. The method of claim 12, wherein the organic film contains one or more of a long chain alkyl group having at least two carbons, an amine or an aromatic ring that provides mobile electrons.

15. The method of claim 12, wherein the organic film comprises one or more of an alkyl ammonium-terminated silane coupling agent having an alkyl group with a length greater than or equal to two carbons, an aromatic compound or a long chain alkyl group with a length greater than or equal to two carbons.

16. The method of claim 12, wherein the organic film comprises one or more of 3-aminopropyltriethoxysilane (GAPS), poly(allylamine) or octadecyldimethyl(3-trimethoxysilylpropyl)ammonium chloride.

17. The method of claim 12, wherein the B-side of the glass substrate has a zeta potential in a range from about −30 mV to about 40 mV at neutral pH.

* * * * *